United States Patent [19]

Imamoto et al.

[11] Patent Number: 5,779,060
[45] Date of Patent: Jul. 14, 1998

[54] STRUCTURE OF RACK

[75] Inventors: Takashi Imamoto; Hirotoshi Takada; Toshiaki Miyamaru; Akihiro Hamaguchi, all of Kawasaki, Japan

[73] Assignee: Fujitsu Limited, Kawasaki, Japan

[21] Appl. No.: 325,827

[22] Filed: Oct. 19, 1994

[30] Foreign Application Priority Data

Mar. 18, 1994 [JP] Japan ................................ 6-049502

[51] Int. Cl.[6] ............................................................. A47F 5/00
[52] U.S. Cl. ............................... 211/26; 211/189; 248/680
[58] Field of Search ............................ 211/26, 189, 183; 248/188.91, 188.9, 188.1, 505, 681, 680, 500, 156; 312/198, 216, 223.2

[56] References Cited

U.S. PATENT DOCUMENTS

| 3,389,885 | 6/1968 | Friedman et al. ................. 248/505 |
| 4,309,018 | 1/1982 | Reiss ............................... 248/505 X |
| 4,695,211 | 9/1987 | Van Ipern et al. ................ 248/505 X |
| 4,805,859 | 2/1989 | Hudson .......................... 248/680 X |
| 4,988,008 | 1/1991 | Blum et al. ..................... 211/26 X |
| 5,082,233 | 1/1992 | Ayers et al. .................... 248/681 X |
| 5,116,015 | 5/1992 | Gassaway ....................... 248/681 X |
| 5,176,437 | 1/1993 | Remington ..................... 248/680 X |
| 5,192,123 | 3/1993 | Wallin ........................... 248/680 X |
| 5,372,266 | 12/1994 | Fisher ............................ 211/189 |

FOREIGN PATENT DOCUMENTS 4-289391   10/1992   Japan .

*Primary Examiner*—Robert W. Gibson, Jr.
*Attorney, Agent, or Firm*—Armstrong, Westerman, Hattori, McLeland & Naughton

[57] ABSTRACT

In a structure in which racks back-to-back with each other are placed on a floor, a bottom of at least one of the racks is pressed against the floor by a connecting bar crossing the bottom. In a structure in which a cover is mounted on a rack, a cover has a first shaft movable in a direction parallel to the first shaft and the cover is mounted on the rack by using the first shaft. In a structure in which a cable rack is mounted on a top surface of a rack, a plurality of engagement screws provided on the cable rack are driven into holes formed on the top surface of the rack so that the cable rack is mounted on the top surface of the rack.

10 Claims, 18 Drawing Sheets

STRUCTURE OF RACK

BACKGROUND OF THE INVENTION

(1) Field of the Invention

The present invention generally relates to a structure of a rack in which units, such as computer systems or exchange systems, are housed, and more particularly to a structure in which racks are placed on a floor, a structure in which a cover is mounted on a rack and a structure in which a cable rack is fixed on a rack.

Recently, precision equipment, such as a computer system or an exchange system, has been enlarged. Thus, placing the precision equipment in a narrow space is important. In addition, it is desired that the workability of placing the equipment on a floor be improved.

(2) Description of the Related Art

Conventionally, for example, in a case of an exchange system 100, as shown in FIG. 1, a plurality of racks in each of which a unit is housed are arranged under a condition in which side surfaces of adjacent racks are connected. This arrangement of the racks is referred to as a rack bank. If the scale of the exchange system 100 is increased, the system is formed of a plurality of rack banks, not only one. In a case where the system is formed of a plurality of rack banks, conventionally, a space is provided between the rack banks. The space is used as a maintenance area F in which maintenance works for units in the rack, such as work for fixing the racks on the floor, are to be performed. A method by which the rack banks are separately placed on the floor is referred to as a single-placing method.

Furthermore, in order to efficiently place racks on a floor, a method has been proposed, by which method back surfaces of the adjacent rack banks are connected to each other so that there is no space between the adjacent rack banks. This method is referred to as a back-to-back placement method (a BTB placement method). In the case of the BTB placement method, the racks are placed on the floor in accordance with a procedure as shown in FIGS. 4A–4E. First, respective racks 10(11), 10(12), . . . in a front rack bank are fixed on the floor by fixtures such as anchor bolts. Next, racks 10(21), 10(22), . . . in a rear rack bank are arranged so that back surfaces are in contact with the back surfaces of the racks in the front rack bank, and the racks in the rear rack bank are fixed on the floor by fixtures such as the anchor bolts.

In each of the racks, as shown in FIGS. 2 and 3, a unit U is mounted in a space surrounded by posts 12a, 12b, 13a and 13b on a pedestal 11. Four corner portions of the pedestal 11 are fixed on a floor 200 by anchor bolts 15. In a case where the front rack bank and the rear rack bank each of which is formed of racks having the above structure are placed in accordance with the above procedure under a condition in which the back surfaces of the front rack bank and the rear rack bank are connected, it is difficult to fix the respective racks in the rear rack bank at back positions. That is, since a space Sp between the unit U located at the lowest position and the pedestal 11 is small, work for driving anchor bolts at back corners of the pedestal 11 is difficult, which work is to be carried out from the front surface of each rack in the rear rack bank. In addition, in a case where back corners of the pedestal 11 at which anchor bolts are to be driven are hidden behind the posts 13a and 13b as shown in FIG. 2, the work for driving the anchor bolts is difficult. Thus, conventionally, the back corners of the pedestal 11 of each rack in the rear rack bank are not fixed on the floor, as shown in FIGS. 4B–4E. In FIGS. 4B–4E, (o) indicates a an anchor bolt is driven and (X) indicates a position at which an anchor bolt is not driven.

In the above structure in which the racks are placed on the floor as shown in FIGS. 1–4E, the work for driving the anchor bolts cannot be performed at the back corners of the respective racks in the rear rack bank. Thus, the fixing strength of the rear rack bank is smaller than that of the front rack bank.

In addition, in order to protect a unit housed in a rack, to prevent dust from entering in a rack, to take EMI measurements and to prevent noises generated in a rack from leaking to the outside thereof, there is a case where a cover is provided on the rack as shown in FIG. 5. After a rack body 10a is placed on a floor and wiring of units housed in the rack 10a is completed, a cover 20 is attached to the rack body 10a. To be capable of enabling a performance of maintenance work for the units housed in the rack body 10a, the cover 20 can be opened. To be capable of enabling an opening and shutting of the cover 20, supporting structures 22a and 24a are provided at an upper end portion and a bottom end portion of an edge of a frame of the rack body 10a, structures 22b and 24b rotatably engaged with the supporting structures 22a and 24a are provided at an upper end portion and a bottom portion of an edge of the cover 20.

When the system housed in the rack is enlarged so that the size of the rack is increased, the size and weight of the cover 20 as shown in FIG. 5 are increased. It is difficult to mount the large and heavy cover 20 on the rack body 10a after the rack body 10a is placed on the floor.

Furthermore, due to increasing the density of parts of the system, a number of cables in a rack is increased. In order to efficiently arrange the cables without increasing an area in which the rack is placed, a cable rack 40 is, as shown in FIG. 6, provided on a top surface of the rack body boa. Screws 42 are inserted from the upper side of the cable rack 40 into holes 41 formed on the top surface of the rack body 10a so that the cable rack 40 is screwed on the rack body 10a.

Due to fixing the cable rack 40 onto the top surface of the rack body 10a as shown in FIG. 6, the wiring of a large number of cables can be performed without increasing an area in which the rack is placed. However, the height of the rack is increased. The height of the rack is limited by the height of an entrance of a room in which the system should be placed and the size of a transportation (e.g. a truck, a plane or a train) for transporting the rack. Thus, it is preferable that the rack body boa and the cable rack 40 be separately transported. In this case, the cable rack 40 must be mounted on the top surface of the rack body 10a in a place in which the system is placed. Thus, the conventional structure in which the cable rack 40 is screwed on the rack body 10a has an inferior workability for mounting the cable rack 40 on the rack body 10a.

SUMMARY OF THE INVENTION

Accordingly, a general object of the present invention is to provide a novel and useful structure of a rack housing equipment, in which the disadvantages of the aforementioned prior art are eliminated.

A more specific object of the present invention is to provide a structure in which racks in the front rack bank and the rear rack bank to be placed in accordance with the BTB placement method can be easily and steadily fixed on a floor.

The above objects of the present invention are achieved by a structure in which racks back-to-back with each other are placed on a floor comprising: a fixing base block located in a border between the racks and fixed on the floor, the fixing base block having a hole; and a connecting bar having a first end portion inserted into the hole of the fixing base block and a second end portion fixed on the floor, the connecting bar crossing a bottom of one of the racks so that the bottom surface of the one of the racks is pressed against the floor by the connecting bar.

The above objects of the present invention are also achieved by a structure in which racks back-to-back with each other are placed on a floor comprising: a member fixed on a bottom of one of the racks, the member having a hole; and a connecting bar having a first end portion inserted into the hole of the member and a second end portion fixed on the floor, the connecting bar crossing a bottom of one of the racks so that the bottom of the one of the racks is pressed against the floor by the connecting bar.

The above objects of the present invention are also achieved by a structure in which racks back-to-back with each other are placed on a floor comprising: a connecting bar crossing bottoms of both the racks; and fixtures fixing both end portions of the connecting bar on the floor.

According to the present invention, since the bottom of at least one of the racks back-to-back with each other is pressed against the floor by the connecting bar so that the racks are placed on the floor, the racks can be placed on the floor in accordance with the BTB placing method easily.

Another object of the present invention is to provide a structure in which a cover can be easily mounted on a rack.

The object of the present invention is achieved by a structure in which a cover is mounted on a rack comprising: a first shaft provided on the cover, the first shaft capable of moving in a direction parallel to the first shaft, the first shaft being capable of being in a first position and a second position; a first supporting member provided on the rack, the supporting member having a hole into which the first shaft of the cover maintained in the first position is inserted; a second shaft; and a second supporting member rotatably supporting the second shaft, the second shaft being provided for one of the rack and the cover and the second supporting member being provided for another one of the rack and the cover, wherein after the second shaft is supported by the second supporting member in a state where the first shaft is maintained in the second position, the first shaft is moved to the first position so as to be inserted into the hole of the first supporting member.

According to the present invention, since the cover is mounted on the rack by using the first shaft which can be maintained in the first position and the second position, the cover can be mounted on the rack in a state where the cover is supported by two hands. Thus, the cover can be easily mounted on the rack.

Still another object of the present invention is to provide a structure in which a cable rack can be easily mounted on the top surface of a rack body.

The object of the present invention is achieved by a structure in which a cable rack is mounted on a top surface of a rack comprising: engagement screws fixed on the cable rack; and engagement portions provided with the top surface of the rack, a hole being formed on each of the engagement portions, each of the engagement screws of the cable rack being inserted and driven into the hole of a corresponding one of the engagement portions so that the cable rack is mounted on the top surface of the rack.

According to the present invention, since the cable rack can be fixed on the top surface of the rack by only driving the engagement screws provided on the cable rack into the holes formed on the top surface of the rack, the cable rack can be easily mounted on the top surface of the rack.

BRIEF DESCRIPTION OF THE DRAWINGS

Other objects, features and advantages of the present invention will become apparent from the following detailed description when read in conjunction with the accompanying drawings, in which.

DESCRIPTION OF THE PREFERRED EMBODIMENTS

A description will be given of an embodiment of the present invention.

Figure 7:
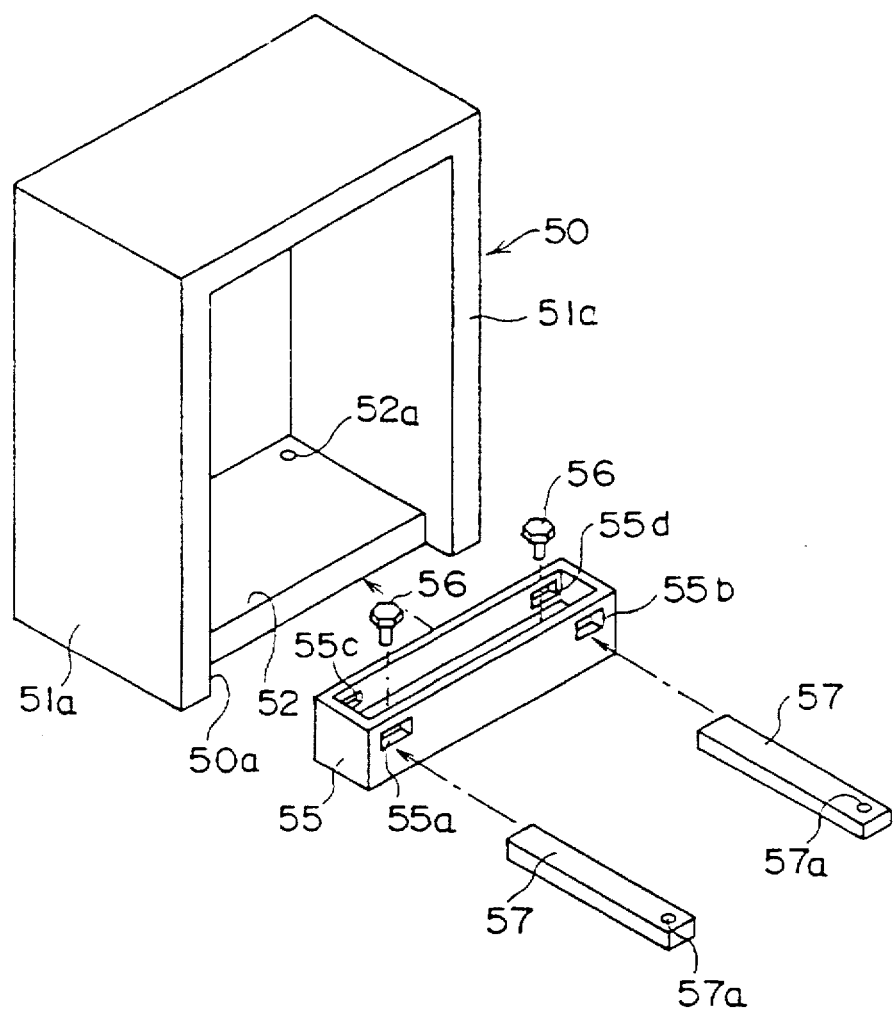
FIG. 7 is an exploded perspective view showing a structure, according to an embodiment of the present invention, in which a rack is placed on a floor.

FIGS. 7, 8, 9 and 10 show a structure, according to an embodiment of the present invention, in which a rack is placed on a floor. The rack in this embodiment is a self-standing rack for housing an exchange system of a station. To place a rack 50 in accordance with the BTB placement method, a fixing base block 55 and connecting bars 57 are used. In a case where the rack is placed on a risen floor, the fixing base block 55 is fixed by bolts and nuts substituted for anchor bolts. Since the fixing base block 55 is used to place the rack, the shape of a pedestal 52 which is a bottom of the rack 50 slightly differs from the shape of that of the conventional rack. As shown in FIG. 7, a cut-out portion 50a with which the fixing base block 55 is to be engaged is formed on an edge of the pedestal 52 between both supporting walls 51a and 51a at the back side of the rack 50. The fixing base block 55 is box-shaped and has a length equal to or less than a length obtained by subtracting thicknesses of the supporting walls 51a and 51a from the width of the rack 50 and a width sufficient to perform a work for driving anchor bolts 56 in the fixing base block 55. Four rectangular holes 55a, 55b, 55c and 55d are formed in the fixing base block 55. The ends of the connecting bars 57 are inserted in the rectangular holes 55a, 55b, 55c and 55d. The respective connecting bars 57 are rectangular bars having ends, opposite to the ends which are to be inserted in the rectangular holes 55a, 55b, 55c and 55d of the fixing base block 55, on which holes 57a used for the anchor bolts 56 are formed.

Figure 8:
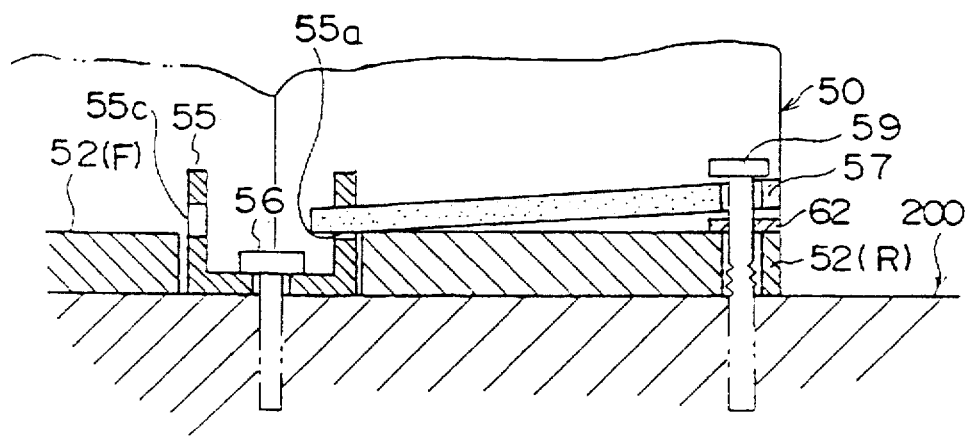
FIG. 8 is a cross sectional view showing the structure, according to the embodiment of the present invention, in which the rack is placed on the floor.
Figure 9:
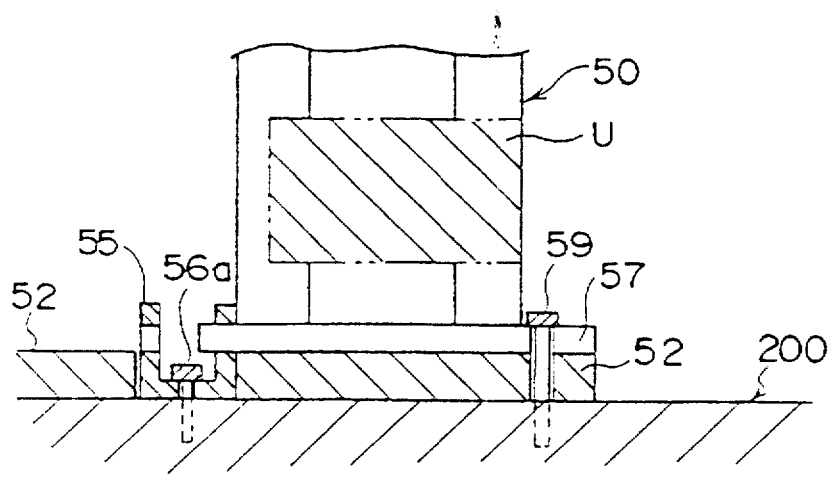
FIG. 9 is a cross sectional view showing the structure, according to the embodiment of the present invention, in which the rack is placed on the floor.

First, the fixing base block 55 is fixed on a floor 200 by using the anchor bolts 56. The rack 50 is placed on the floor 200 under a condition in which the cut-out portion 50a of the pedestal 52 is engaged with the fixing base block 55 fixed on the floor. Two racks 50 are placed so as to surround the fixing base block 55 in a state where the back surfaces thereof are in contact with each other. In this state, the connecting bars 57 are passed from the front side of the rack 50 through a space between the pedestal 52 and the unit, and the ends of the connecting bars 57 are inserted into the rectangular holes 55a and 55b of the fixing base block 55 or the rectangular holes 55c and 55d of thereof. In this state, each of the connecting bars 57 is in contact with an upper inner surface of a corresponding one of the rectangular holes 55a, 55b, 55c and 55d and the pedestal 52, as shown in FIG. 8, so that each of the connecting bars 57 functions as a lever for which the corresponding one of the rectangular holes is a fulcrum. Anchor bolts 56 and 59, respectively, are made to pass through the holes 57a formed at the ends of the connecting bars 57 and holes 52a formed on the front side corners of the rack 50, and the anchor bolts 56 and 59 are driven into the floor 200. In a state where the anchor bolts 59 have been completely driven into the floor 200, the front portion and the back portion of the pedestal 52 are pressed against the floor 200 by the connecting bars 57. As a result, the rack 50 is strongly fixed on the floor 200, as shown in FIG. 9. In a case where the anchor bolts 59 cannot be completely driven in the floor 200, a liner 62 may be provided between the connecting bar and the pedestal 52.

Figure 10:
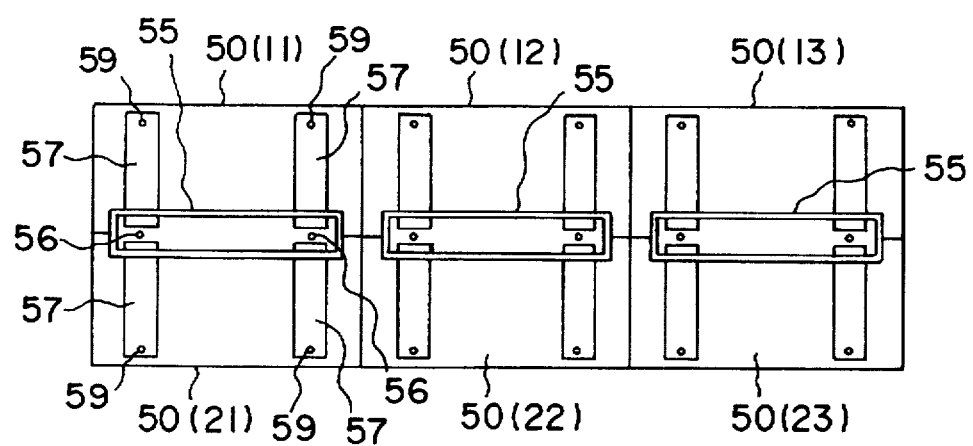
FIG. 10 is a diagram illustrating a rack bank formed of rack having the structure according to the embodiment of the present invention.

According to the above structure in which the racks 50 are placed on the floor 200, as shown in FIG. 10, racks 50(11), 50(12) and 50(13) in the front rack bank and racks 50(21), 50(21) and 50(23) in the rear rack bank are strongly fixed on the floor by the fixing base blocks 55 and the connecting bars 57 in a state where the back surfaces of the racks in both the front rack bank and the rear rack bank are in contact with each other.

Figure 11:
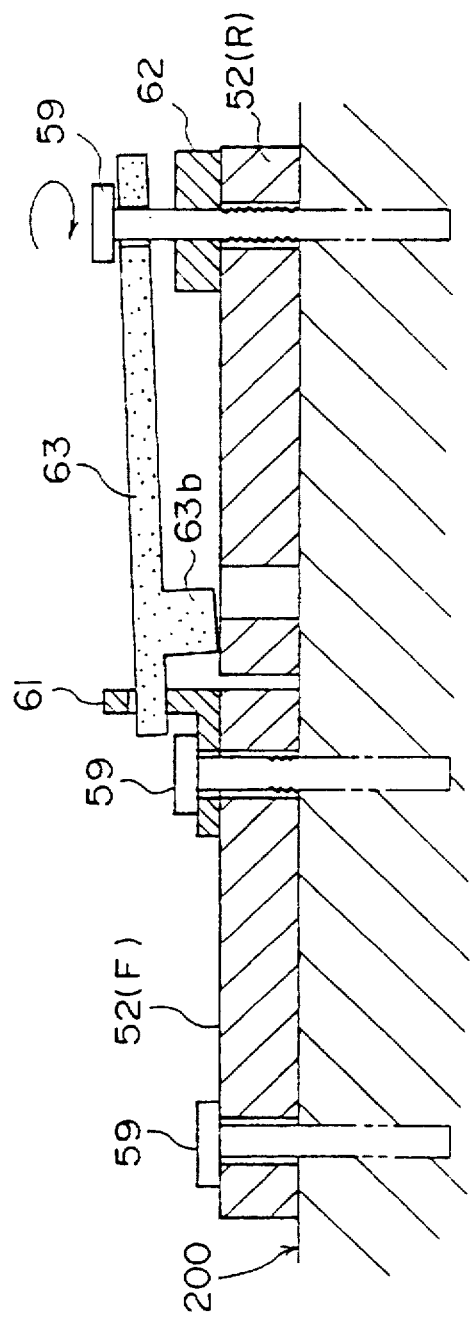
FIG. 11 is a cross sectional view showing a structure, according to another embodiment of present invention, in which racks are placed on a floor.
Figure 12:
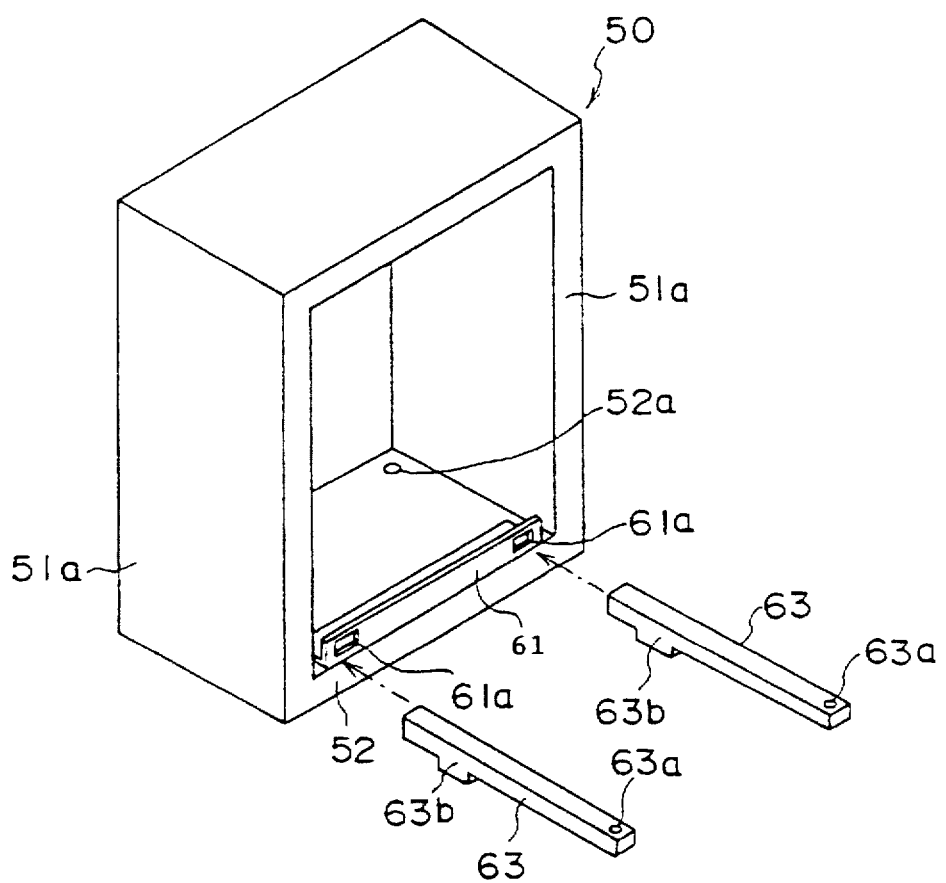
FIG. 12 is an exploded perspective view showing a structure, according to another embodiment of the present invention, in which a rack is placed on a floor.

There is a case where the fixing base blocks 55 described above cannot be used for racks. In this case, the racks are placed on the floor in a structure as shown in FIGS. 11 and 12.

Holes 52a used for anchor bolts are formed at four corners of the pedestal 52 which is the bottom of the rack 50, in the same manner as those in the conventional case. An L-shaped fixture 61 is fixed on the pedestal 52 by using two holes 52a located at the back side of the rack 50. The L-shaped fixture 61 functions as the fixing base block 55 in the above embodiment. The L-shaped fixture 61 is provided with holes corresponding to the holes 52a formed on the pedestal 52 and rectangular holes 61a into which ends of connecting bars 63 are to be inserted. Holes 63a are formed at ends of the connecting bars 62 opposite to the ends which should be inserted into the rectangular holes 61a of the L-shaped fixture 61. Projections 63b are formed on the connecting bars 63 at positions close to the ends which should be inserted into the rectangular holes 61a of the L-shaped fixture 61. The projections 63b function as the fulcrum of a lever. The projection 63b shown in FIGS. 11 and 12 are rectangular-shaped, but may be arc-shaped.

In a case where a rack 50 is initially fixed on the floor 200, two corners of the pedestal 52 (F) at the back side of the rack 50 are fixed along with the L-shaped fixture 61 on the floor 200 by using anchor bolts 59. Two corners of the pedestal 52 (F) at the front side of this rack are fixed on the floor 200 by using anchor bolts 59 in the same manner as those in the conventional case. In this state, a new rack 50 is placed under a condition in which the back surface of the new rack 50 is brought into contact with the back surface of the rack 50 which has been fixed on the floor 200. The connecting bars 63 are then inserted in a space between the pedestal 52 (R) of the new rack 50 and the unit housed in the new rack 50, and the ends of the connecting bars 63 are engaged with the rectangular holes 61a of the L-shaped fixture 61 fixed on the rack 50 initially placed on the floor 200. Other ends of the connecting bars 63 are fixed with the front corners of the pedestal 52 (R) of the new rack 50 by anchor bolts 59 on the floor 200. In this state, the connecting bars 63 function as levers in which the projections 63 are the fulcrums, so that the connecting bars 63 strongly press the pedestal 52 (R) of the rack 50 against the floor 200, in the same manner as those in the above embodiment.

Figure 13:
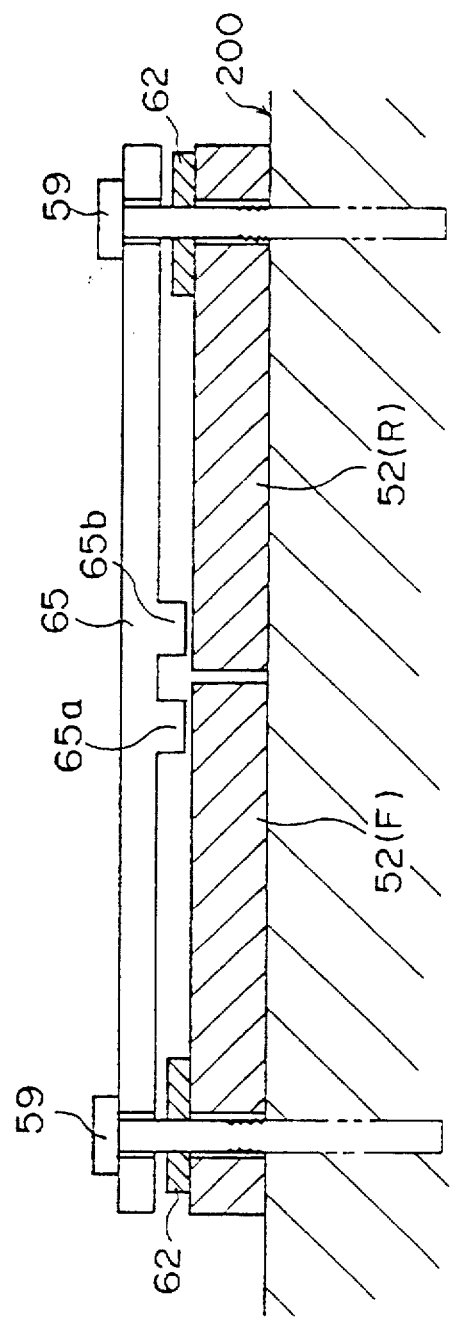
FIG. 13 is a cross sectional view showing a structure, according to still another embodiment of the present invention, in which racks are placed on a floor.

FIG. 13 shows a structure, according to still another embodiment of the present invention, in which the racks are placed on the floor. In this embodiment, large anchor bolts which can generate large fastening strength can be used to place racks in accordance with the BTB placement method. The racks are placed back to back with each other and only the front side of the respective racks are fixed on the floor by anchor bolts. Projections of connecting bars prevent the back side of the respective racks from rising.

As shown in FIG. 13, a connecting bar 65 is a rectangular-shaped bar, and holes used for anchor bolts are formed at both ends of the connecting bar 65. Two projections 65a and 65b are formed on a center portion of the connecting bar 65. Two racks are arranged back-to-back with each other, and the connecting bar 65 is passed from the front side of a rack 50 through a space between the pedestals 52 (F) and 52 (R) and the units housed in the racks 50. At the front sides of the respective racks 50 arranged back-to-back, anchor bolts are passed through the holes formed on the connecting bar 65 and the corners of the pedestals 52(F) and 52(R) and are driven into the floor 200.

According to the above structure, the pedestals 52(F) and 52(R) of the respective racks arranged back-to-back with each other are fixed on the floor by the projections 65a and 65b of the connecting bar 65.

A description will now be given of an embodiment of a structure in which a cover is mounted on a rack.

Figure 1:
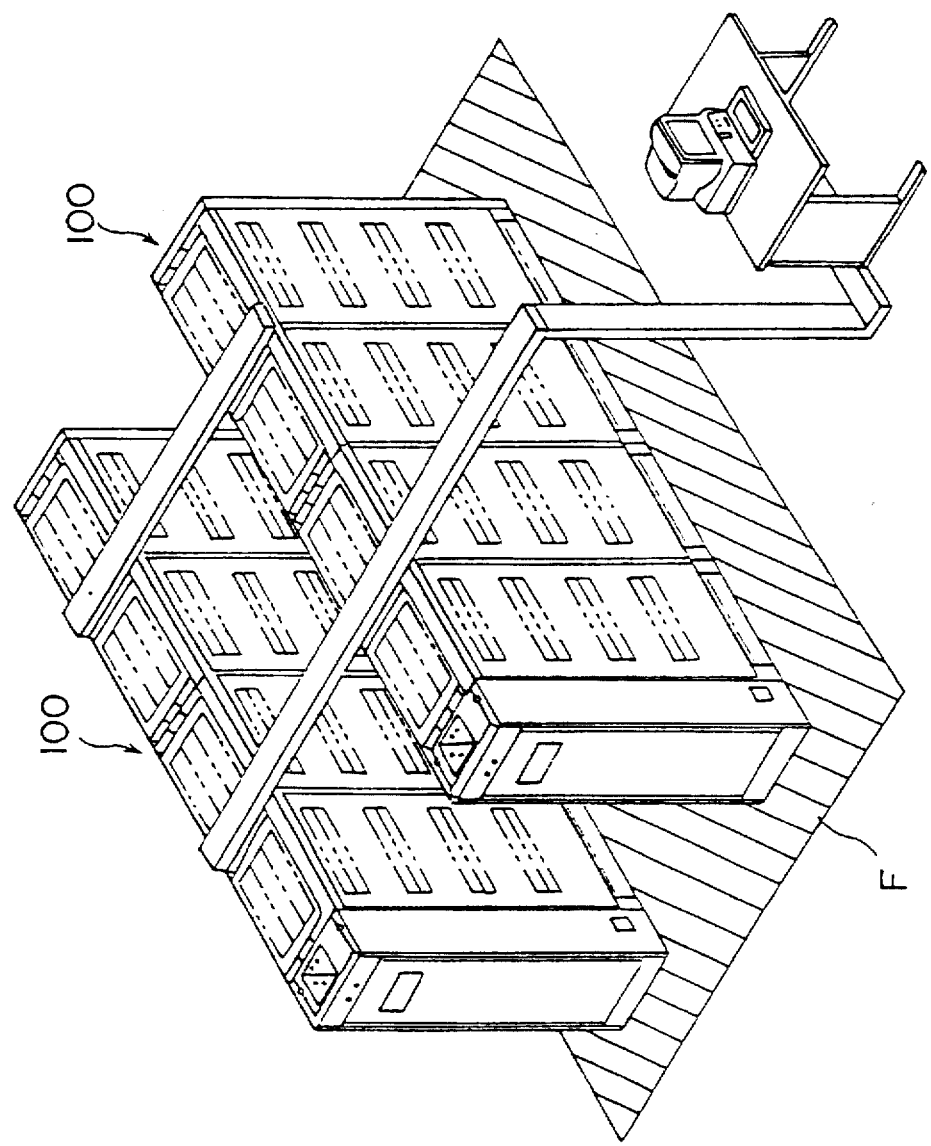
FIG. 1 is a perspective view showing a system placed on a floor.
Figure 2:
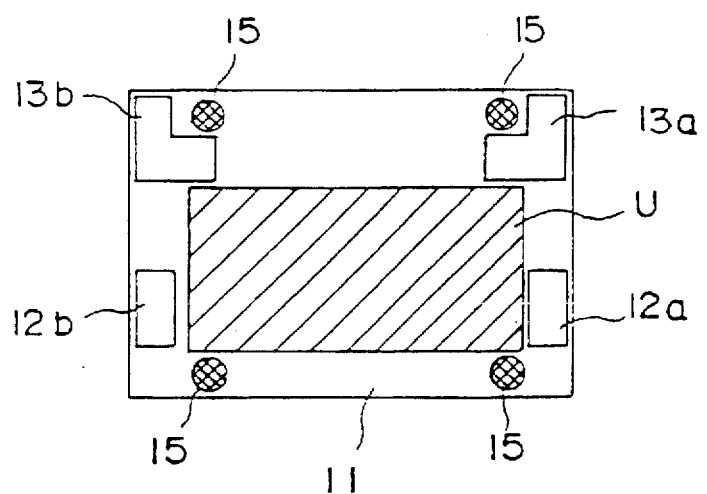
FIG. 2 is a plan view showing a conventional structure in which a rack is placed on a floor.
Figure 3:
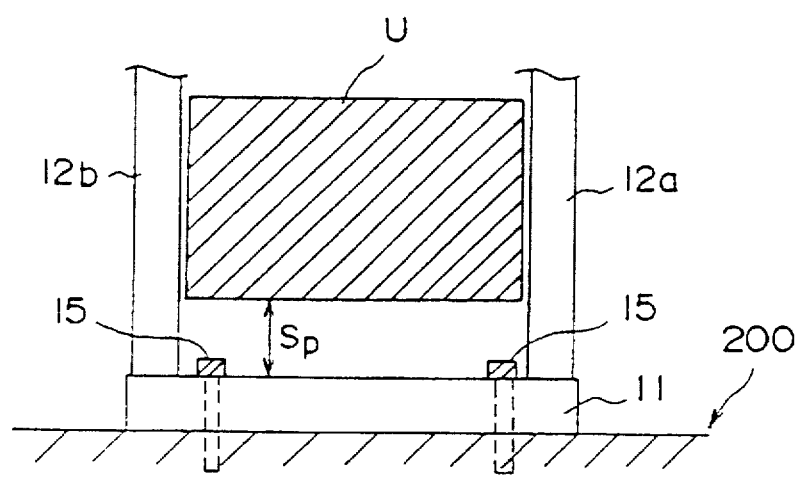
FIG. 3 is a front view showing the conventional structure in which the rack is placed on the floor.
Figure 4:
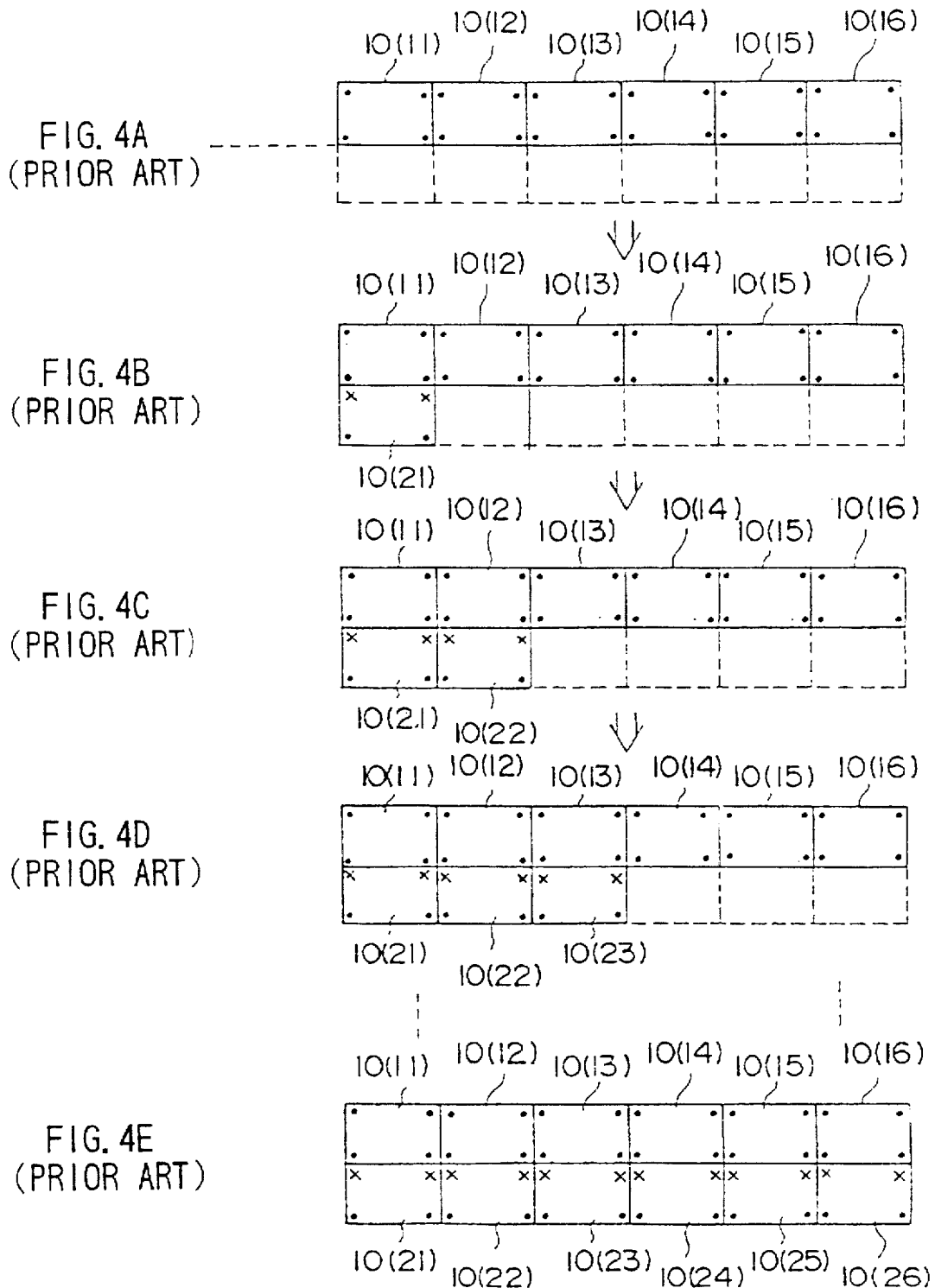
FIGS. 4A, 4B, 4C, 4D and 4E are diagrams illustrating a procedure for placing racks in a front rack bank and a rear rack bank which are to be placed in accordance with the BTB placement method.
Figure 5:
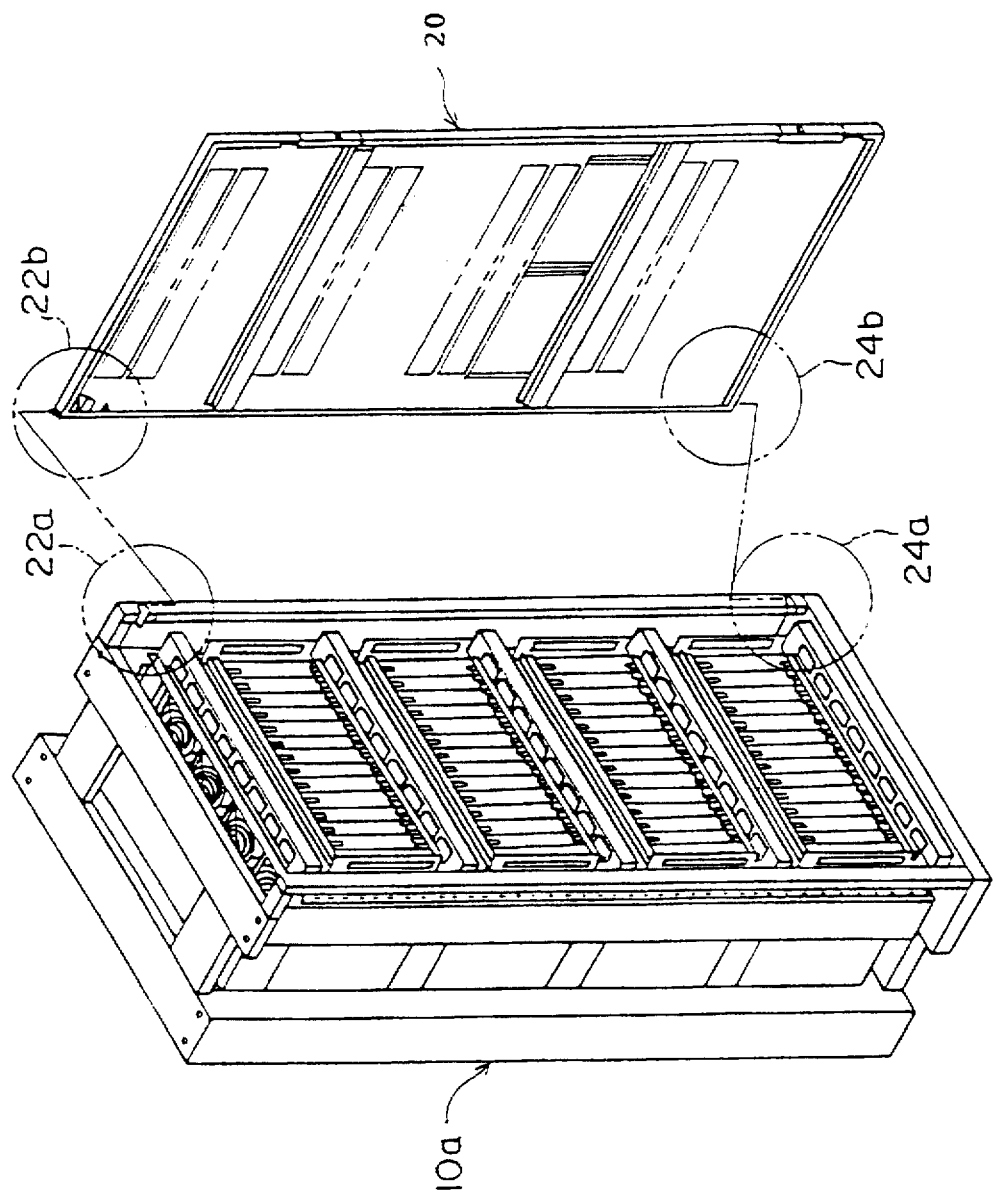
FIG. 5 is a perspective view showing a structure in which a cover is mounted on a rack body.
Figure 6:
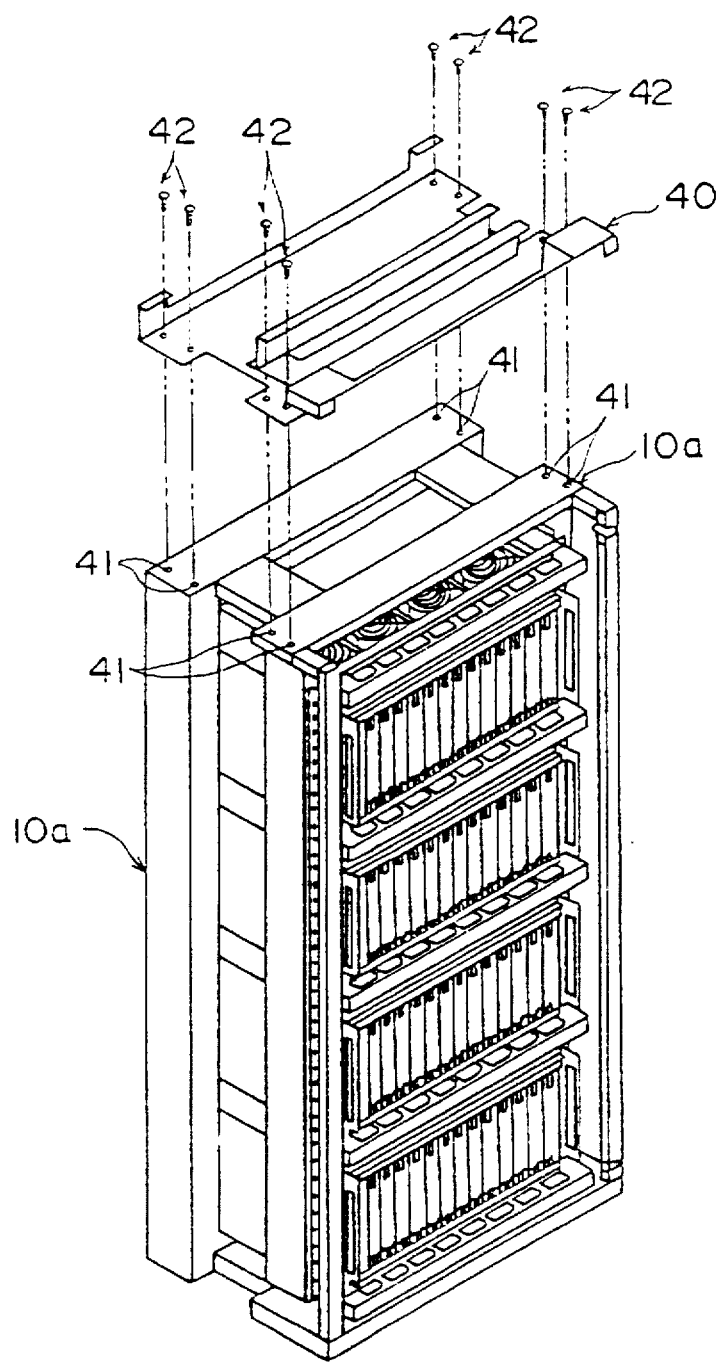
FIG. 6 is a perspective view showing a conventional structure in which a cable rack is mounted on a rack body.
Figure 14:
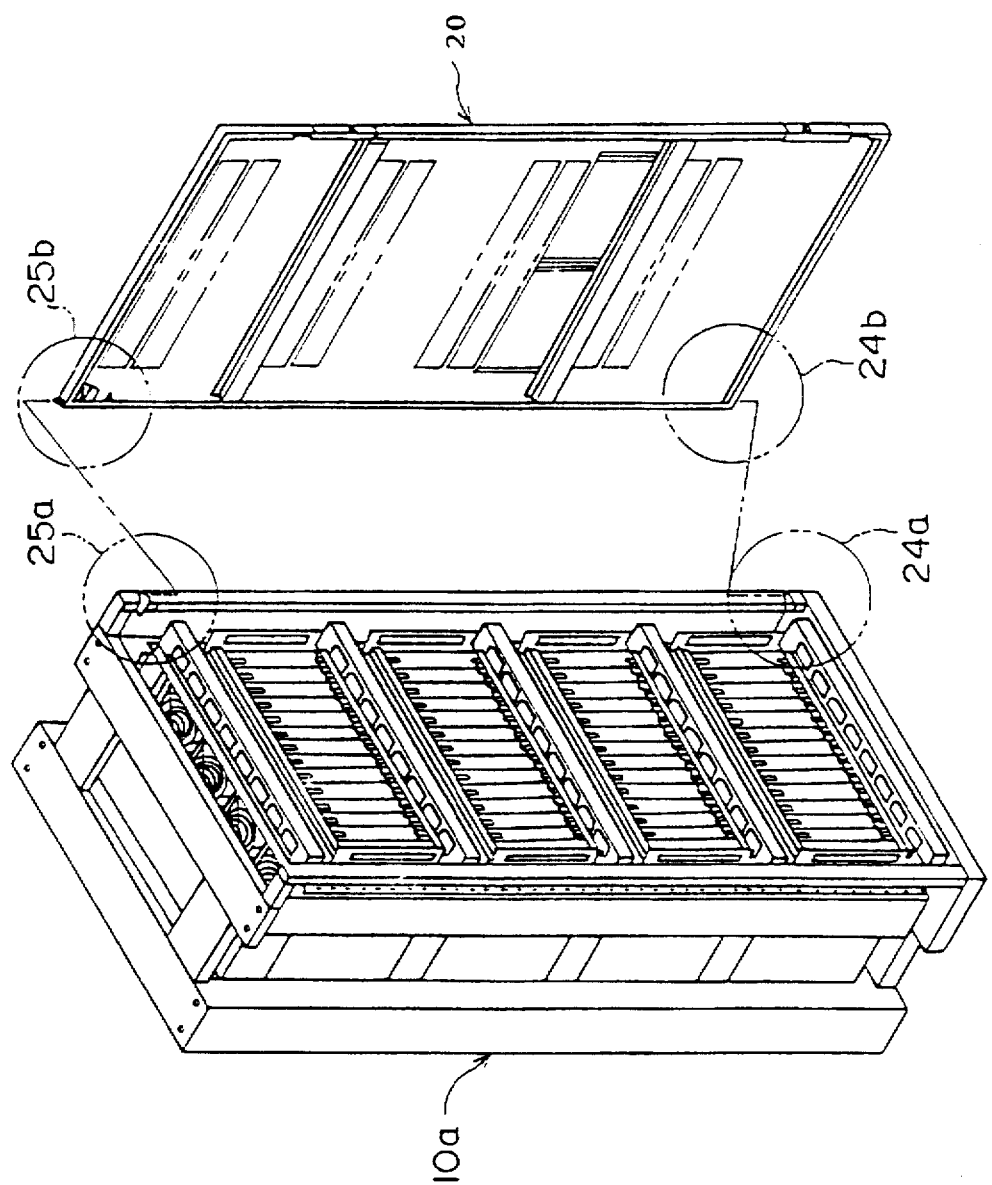
FIG. 14 is a perspective view showing a rack body and a cover to be mounted on the rack body.

In this embodiment, as shown in FIG. 14, a rack has a rack body 10a and a cover 20 detachably mounted on the rack body 10a. The essential structure has, in the same manner as that in the conventional case shown in FIG. 5, supporting structures 25a and 24a are respectively provided in the top portion and in the bottom portion of a side of a frame of the rack body 10a and structures 25b and 24b are respectively provided in the top portion and the bottom portion of a corresponding side of the cover 20. The structures 25b and 24b of the cover 20 are respectively supported by the supporting structure 25a and 24a of the rack body 10a.

Figure 15:
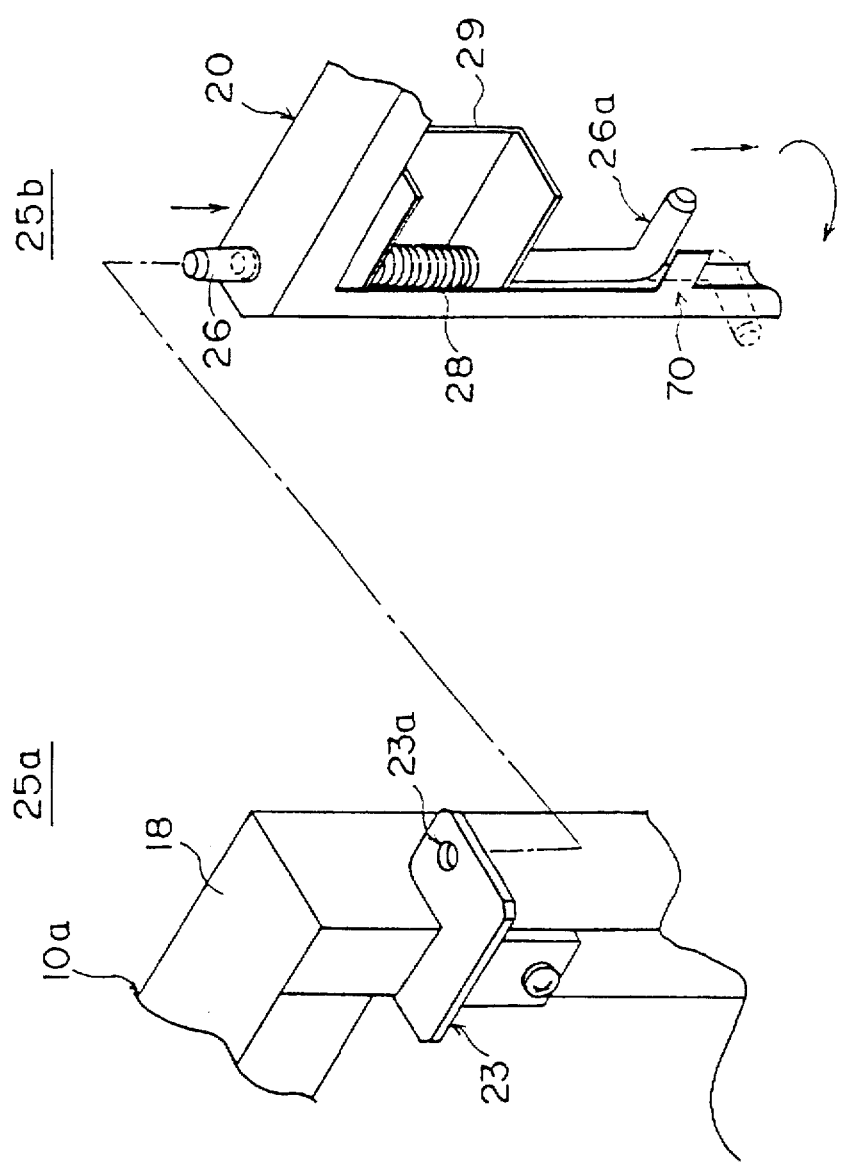
FIG. 15 is a expanded perspective view showing a structure, according to an embodiment of the present invention, in which an upper portion of the cover is engaged with a frame of the rack body.
Figure 16:
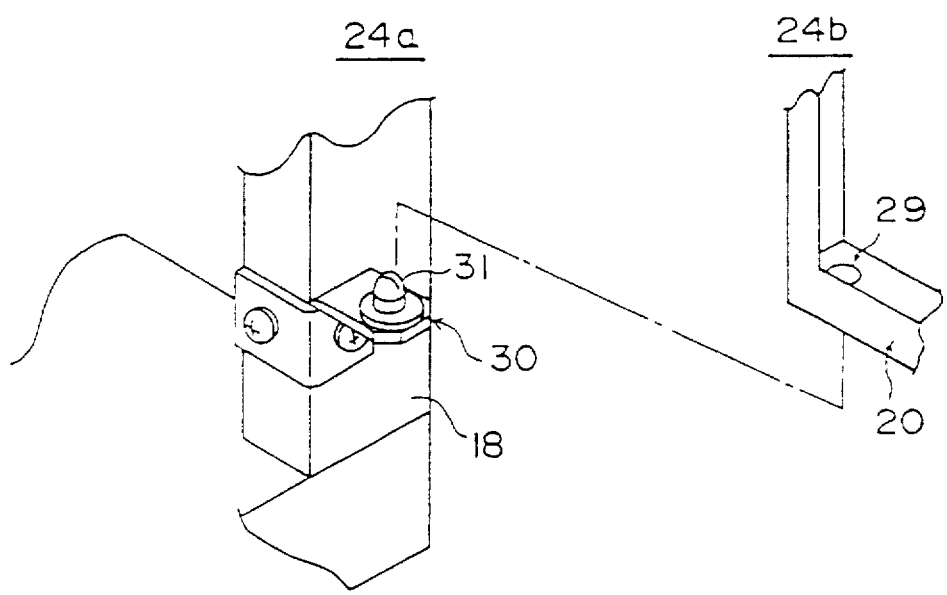
FIG. 16 is an expanded perspective view showing a structure, according to the embodiment of the present invention, in which a bottom portion of the cover is engaged with the frame of the rack body.

The supporting structure 25a provided in the top portion of the rack body 10a and the structure 25b supported by the supporting structure 25a and provided in the top portion of the cover 20 are formed as shown in FIG. 15. The supporting structure 24a provided in the bottom portion of the rack body 10a and the structure 24b supported by the supporting structure 24a and provided in the bottom portion of the cover 20 are formed as shown in FIG. 16. Referring to FIG. 15, the structure 25b of the cover 20 has a lever 26 projecting from the top surface of the cover 20 and a spring 28 pushing the lever 26 upward. An end portion of the lever 26 opposite to the end projecting from the top surface of the cover 20 is bent so that a bent portion 26a is formed. An engage member 70 is formed of a side edge of the cover 20. The bent portion 26a of the lever 26 can be engaged with the engage member 70. In a state where the bent portion 26a of the lever is engaged with the engage member 70, the top end of the lever 26 slightly projects from the top surface of the cover 20. The edge of the top end of the lever 26 is cut so that the lever 26 is tapered. The supporting structure 25a has a plate 23 fixed in the top portion of the frame 18 of the rack body 10a. A hole 23a is formed on the plate 23. The axis of the hole 23a is parallel to the side edge of the frame 18 of the rack body 10a.

Referring to FIG. 16, the supporting structure 24a is formed of a bracket 30 fixed on the frame 18 of the rack body 10a and a shaft 31 projecting from the bracket 30 upward. The structure 24b of the cover 20 supported by the supporting structure 24a has a hole 29 formed in the bottom portion of the cover 20.

The cover 20 is connected to the rack body 10a in accordance with the following procedure.

First, the lever 26 is pulled down and rotated in a direction indicated by an arrow (e.g. a clockwise direction), so that the bent portion 26a of the lever is engaged with the engage member 70 of the cover 20. In this state, the hole 29 of the cover 20 is engaged with the shaft 31 provided on the bracket 30 of the rack body 10a so that the corner of the cover 20 is placed on the bracket 31. The top end of the lever 26 slightly projecting from the top surface of the cover 20 is pressed against the under surface of the plate 23 fixed on the top portion of the rack body 10a as shown in FIG. 15, so that the lever 26 is slightly pushed downward and the bent portion 26a of the lever 26 is disengaged from the engage member 70. In this state, the cover 20 is being pivoted on the shaft 31 with which the hole 29 of the cover is engaged so that the top end of the lever 26 approaches the hole 23a formed on the plate 23. When the top end of the lever 26 reaches to the hole 23a of the plate 23, the top end of the lever 26 which has been pressed on the plate 23 is inserted into the hole 23a. At this time, the bent portion 26a of he lever 26 is engaged with the engage member 70 again. When the bent portion 26a of the lever 26 is rotated and the bent portion 26 is disengaged from the engage member 70, the lever 26 is pushed up by the spring 28 and is completely inserted into the hole 23a of the plate 23 provided on the frame 18 of the rack body 10a. As a result, the cover 20 is mounted on the rack body 10a pivotably on the shaft 31 provided in the bottom portion of the rack body 10a and the lever 26 provided in the cover 20.

According to the above structure in which the cover 20 is mounted on the rack body 10a, since the lever 26 can be engaged with the hole 23a of the plate 23 provided on the rack body 10a under a condition in which the cover 20 is supported by two hands. Thus, it is easy for a worker to mount the cover 20 on the rack body 10a.

Figure 17:
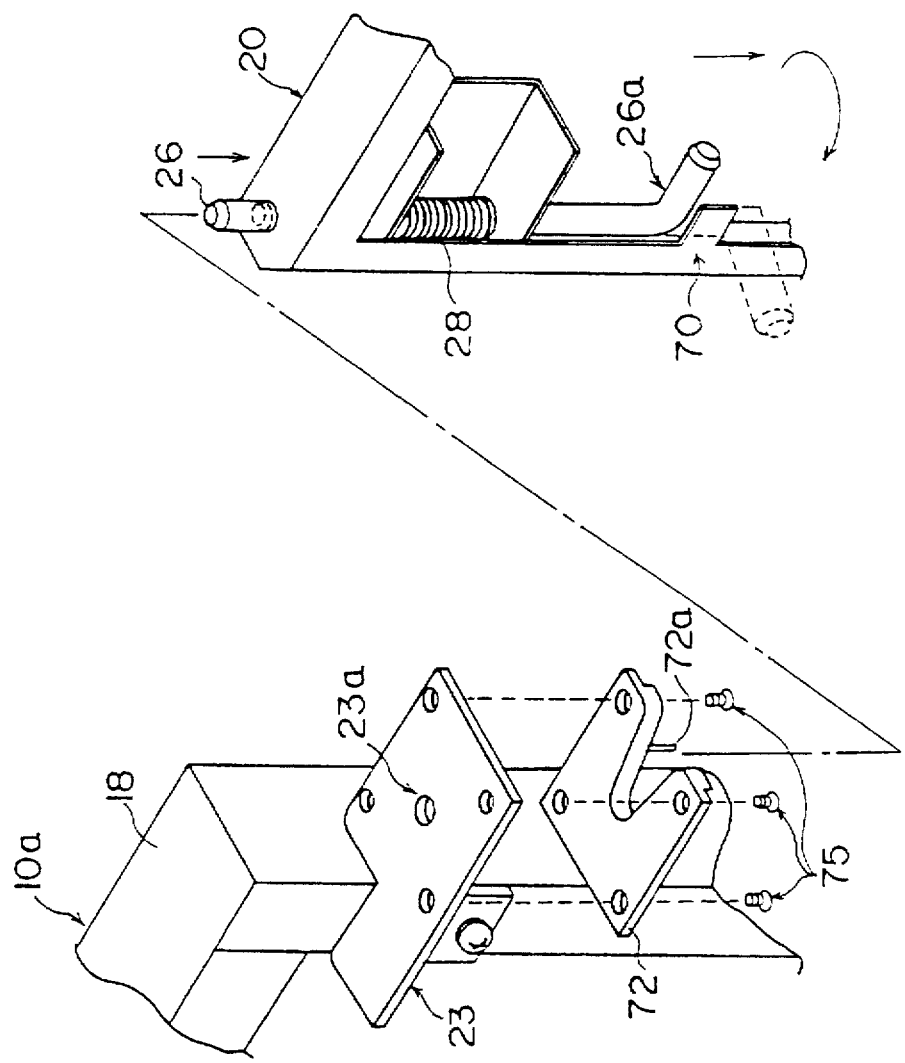
FIG. 17 is an expanded perspective view showing a structure, according to another embodiment of the present invention, in which an upper portion of the cover is engaged with the frame of the rack body.

The supporting structure 25a provided in the top portion of the rack body 10a may be also formed as shown in FIG. 17. In this example, a shaft guide plate 72 is fixed on the under surface of the plate 23 by screws 75. A guide slit 72a is formed on the shaft guide plate 72. The guide slit 72a is shaped so as to gradually narrow starting from an opening end. A closed end of the guide slit 72a corresponds to the hole 23a of the plate 23 on which the shaft guide plate 72 is fixed.

According to the supporting structure 25a shown in FIG. 17, when the cover 20 is mounted on the rack body 10a, the top end of the lever 26 is guided by a wall of the guide slit 72a of the shaft guide plate 72 so that the top end of the lever 26 is automatically led to the hole 23a of the plate 23. Thus, it is easier to mount the cover 20 on the rack body 10a.

A description will now be given of an embodiment of a structure in which a cable rack is fixed on a rack.

Figure 18:
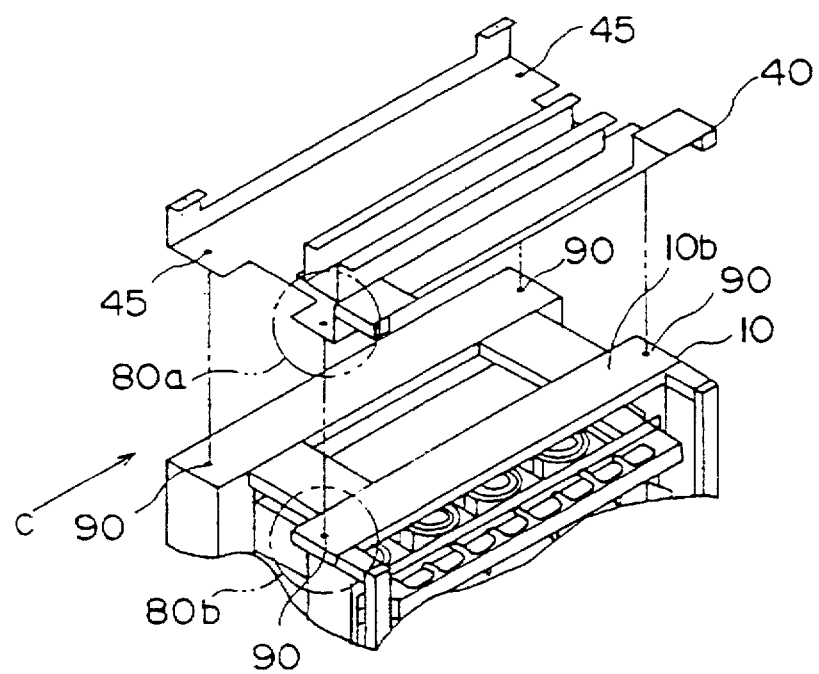
FIG. 18 is an exploded perspective view showing a structure, according to an embodiment of the present invention, in which a cable rack is mounted on a rack body.
Figure 19A:
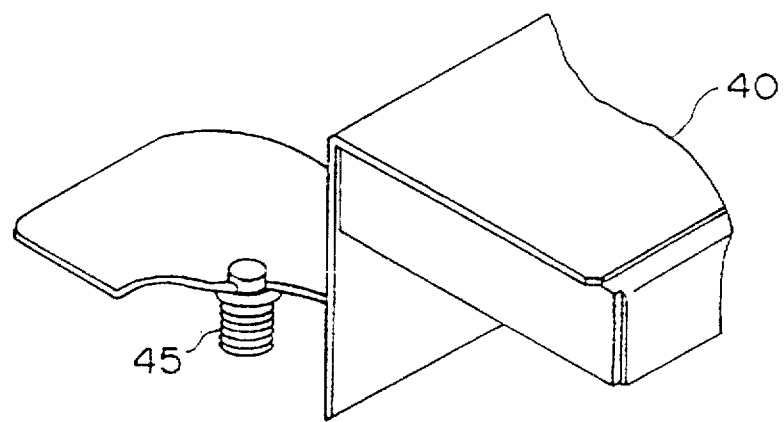
FIGS. 19A and 19B are expanded diagrams illustrating a portion at which the cable rack is engaged with a top surface of the rack body.

As shown in FIG. 18, a cable rack 40 is mounted on a top surface 10b of the rack 10. When the cable rack 40 is carried out from a factory, engagement screws 45 have been fixed on four corners of the cable rack 40. A portion 80a of cable rack 40 including an engagement screw 45 is formed as shown in FIG. 19A. That is, the engagement screw 45 projects from a surface of the portion 80a downward. The engagement screw 45 may be formed of a driving screw or a bolt substituted for the driving screw. A number of engagement screws 45 fixed on the cable rack 40 depends on the size of the cable rack 40. In this embodiment, four engagement screws 45 are fixed on the cable rack 40.

Figure 19B:
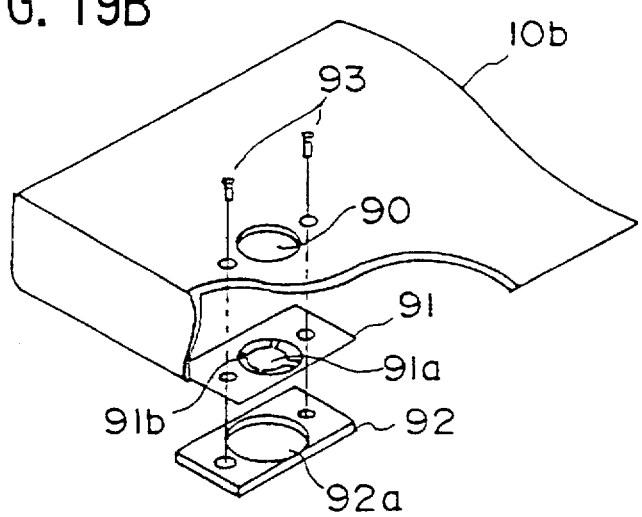

Holes 90 are formed at positions on the top surface 10b of the rack 10 corresponding to the engagement screws 45 of the cable rack 40. A portion 80b of the top surface 10b including a hole 90 is formed as shown in FIG. 19B. Referring to FIG. 19B, a leaf spring 91 and a fixing plate 92 are fixed on a rear surface opposite to the top surface 10b by screws 93. The leaf spring 91 is sandwiched between the rear surface and the fixing plate 92. A hole 91a and a hole 92a are respectively formed on the leaf spring 91 and the fixing plate 92 so as to be coaxial to the hole 90 formed on the top surface 10b of the rack 10. Fins 91b are formed in an inner circumference portion of the hole 91a of the leaf spring 91.

Figure 20:
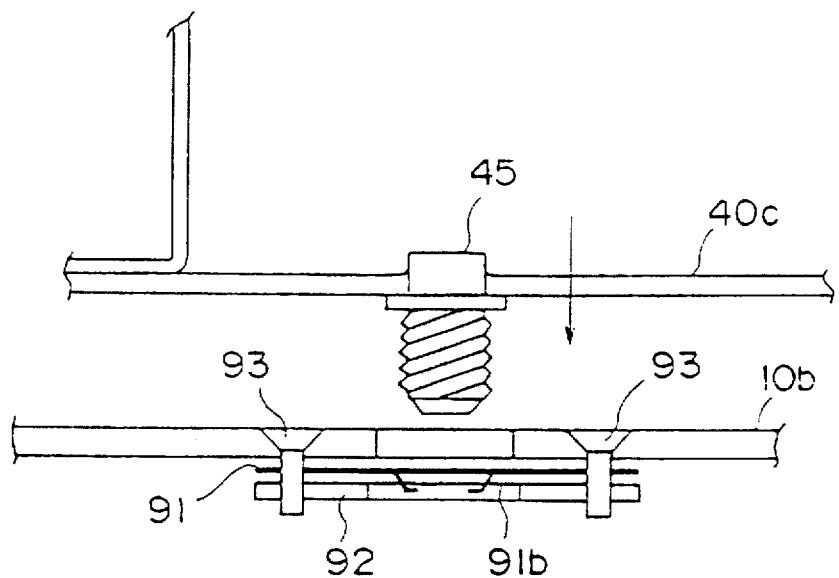
FIG. 20 is a diagram illustrating a state before the cable rack is fixed on the rack body.
Figure 21:
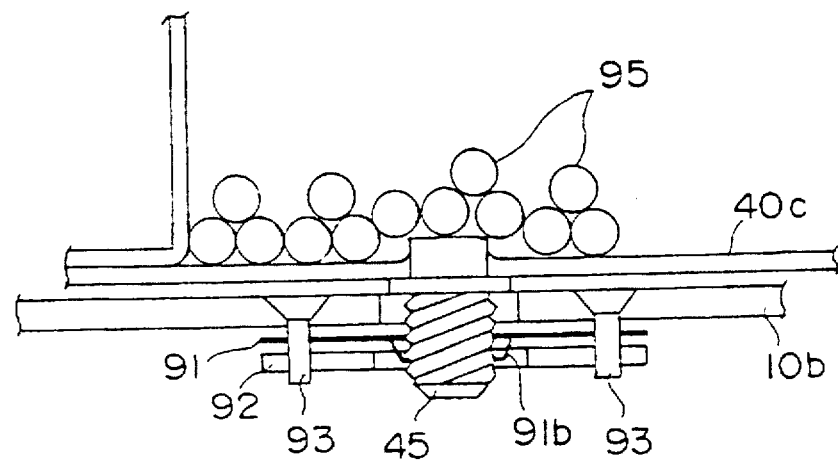
FIG. 21 is a diagram illustrating a structure in which the cable rack is fixed on the top surface of the rack body.

FIG. 20 shows a structure of the portion 80a of the cable rack 40 and the portion 80b of the top surface 10b of the rack 10 viewed in a direction indicated by an arrow C shown in FIG. 18. At a place on which the rack 10 is to be placed, the cable rack 40 is lifted to the top surface 10b of the rack 10 by workers. The position of the cable rack 40 is adjusted so that the tip ends of the engagement screws 45 of the cable rack 40 are engaged with the holes 90 formed on the top surface 10b of the rack 10. The cable rack 40 is then pressed against the top surface 10b of the rack 10. Thus, each of the engagement screws 45 of the cable rack 40 is driven into a corresponding one of the holes 91a of the leaf springs 91. The fins 91b formed in the inner circumference portion of the hole 91a are engaged with the thread of the engagement screw 45 so as to prevent the engagement screw 45 from being extracted from the hole 91a. In addition, even if each of the engagement screws 45 is not sufficiently driven into the holes 91a of the leaf springs 91, after the cable rack 40 is mounted on the rack 10, the cable rack 40 is steadily fixed on the top surface 10a of the rack by the weight of the cable rack 40 in which cables 95 pass as shown in FIG. 21.

The present invention is not limited to the aforementioned embodiments, and variations and modifications may be made without departing from the scope of the claimed invention.

What is claimed is:

1. In combination:
   a) at least two racks adapted to be placed back-to-back with each other on a floor
   b) a structure including
      a fixing base block located in a border between the racks and adapted to be fixed on the floor, said fixing base block having a hole; and
      a connecting bar having a first end portion inserted into the hole of the fixing base block and a second end portion adapted to be fixed on the floor, said connecting bar crossing a bottom of one of said racks so that a bottom surface of the one of the racks is adapted to be pressed against the floor by the connecting bar.

2. In combination:
   a) at least first and second racks adapted to be placed back-to-back with each other on a floor
   b) a structure including:
      a member fixed on a bottom of said first rack, said member having a hole; and
      a connecting bar having a first end portion inserted into the hole of the member and a second end portion adapted to be fixed on the floor, said connecting bar crossing a bottom of said second rack so that a bottom surface of said second rack is adapted to be pressed against the floor by the connecting bar.

3. In combination:
   a) at least two racks adapted to be placed back-to-back with each other on a floor
   b) a structure including:
      a connecting bar crossing bottoms of both of the racks; and
      fixtures adapted to fix both end portions of said connecting bar to the floor at opposite sides of said at least two racks;
   wherein said connecting bar has projecting fulcrums extending from a lower surface thereof at adjacent sides of said racks.

4. The combination of claim 1, wherein said fixing base block and said second end portion of said connecting bar are each adapted to be fixed to the floor by at least one bolt.

5. The combination of claim 2, wherein said member is fixed on a pedestal below said first rack.

6. The combination of claim 5, wherein said member is L-shaped and is adapted to be bolted to said floor through said pedestal.

7. The combination of claim 2, wherein said connecting bar has a projecting fulcrum extending from a lower surface thereover adjacent said member.

8. The combination of claim 3, wherein said connecting bar has projecting fulcrums extending from a lower surface thereof at adjacent sides of said racks.

9. The combination of claim 1, wherein said connecting bar has projecting fulcrums extending from a lower surface thereof.

10. The combination of claim 1, wherein said connecting bar extends along a lower side of said one of the racks and fits in a cut-out portion in said one of the racks.

* * * * *